(12) United States Patent
Gasquet et al.

(10) Patent No.: US 7,780,315 B2
(45) Date of Patent: Aug. 24, 2010

(54) HEAT DISSIPATION COMPONENT AND DIODE LIGHTING AND/OR SIGNALLING DEVICE EQUIPPED WITH A COMPONENT OF THIS TYPE

(75) Inventors: Jean-Claude Gasquet, Saint Clement (FR); Alcina Tanghe, Jouars Pontchartrain (FR)

(73) Assignee: Valeo Vision, Bobigny (FR)

( * ) Notice: Subject to any disclaimer, the term of this patent is extended or adjusted under 35 U.S.C. 154(b) by 249 days.

(21) Appl. No.: 11/751,127

(22) Filed: May 21, 2007

(65) Prior Publication Data

US 2007/0268703 A1    Nov. 22, 2007

(30) Foreign Application Priority Data

May 22, 2006    (FR)    .................................. 06 04575

(51) Int. Cl.
*F21V 29/00*    (2006.01)
*F21V 1/00*    (2006.01)
*F21V 3/00*    (2006.01)

(52) U.S. Cl. .................... 362/294; 362/238; 362/311.02

(58) Field of Classification Search ................. 362/235, 362/236, 237, 238, 240, 294, 311.02
See application file for complete search history.

(56) References Cited

U.S. PATENT DOCUMENTS

| | | | |
|---|---|---|---|
| 5,357,536 A | 10/1994 | Andrews | |
| 6,208,517 B1 * | 3/2001 | Prince et al. | ................. 361/704 |
| 6,428,189 B1 | 8/2002 | Hochstein | |
| 7,170,151 B2 | 1/2007 | Elpedes et al. | |
| 7,198,387 B1 * | 4/2007 | Gloisten et al. | ............. 362/294 |
| 7,210,833 B2 | 5/2007 | Gasquet et al. | |
| 7,230,831 B2 * | 6/2007 | Luckner et al. | ............. 361/719 |
| 7,241,038 B2 * | 7/2007 | Naniwa et al. | .............. 362/525 |
| 7,325,955 B2 * | 2/2008 | Lucas et al. | ................. 362/545 |
| 7,349,163 B2 * | 3/2008 | Angelini et al. | ............. 359/708 |
| 7,404,655 B2 * | 7/2008 | Walser et al. | ................ 362/494 |
| 7,495,322 B2 * | 2/2009 | Hashimoto et al. | .......... 257/676 |
| 2004/0140543 A1 | 7/2004 | Elpedes et al. | |
| 2004/0190294 A1 | 9/2004 | Gasquet et al. | |
| 2005/0135105 A1 | 6/2005 | Teixeira et al. | |
| 2006/0180821 A1 * | 8/2006 | Fan et al. | ....................... 257/98 |
| 2006/0274528 A1 * | 12/2006 | Chou et al. | .................. 362/294 |

FOREIGN PATENT DOCUMENTS

EP    1139019    10/2001

(Continued)

*Primary Examiner*—Jong-Suk (James) Lee
*Assistant Examiner*—David R Crowe
(74) *Attorney, Agent, or Firm*—Jacox, Meckstroth & Jenkins

(57) ABSTRACT

A heat dissipation component for a vehicle lighting and/or signalling device of the type comprising a printed circuit board, a light-emitting diode comprising a heat dissipation base and a pair of electrical connection tabs and a heat dissipater extending facing the printed circuit board, wherein the heat dissipater comprises a heat exchange portion held against the base the diode and in that the heat exchange portion of the heat dissipater comprises means for orienting the diode that protrude substantially perpendicularly to the heat exchange portion of the dissipater, the heat exchange face of the base of the diode being arranged on an orienting means in such a way that the diode is oriented relative to a reference orientation and a reference plane of the dissipater.

23 Claims, 5 Drawing Sheets

FOREIGN PATENT DOCUMENTS

| | | |
|---|---|---|
| EP | 1439587 | 7/2004 |
| EP | 1463391 | 9/2004 |
| EP | 1544924 | 6/2005 |
| WO | WO 2004105142 A1 * | 12/2004 |
| WO | WO 2005001943 A1 * | 1/2005 |

* cited by examiner

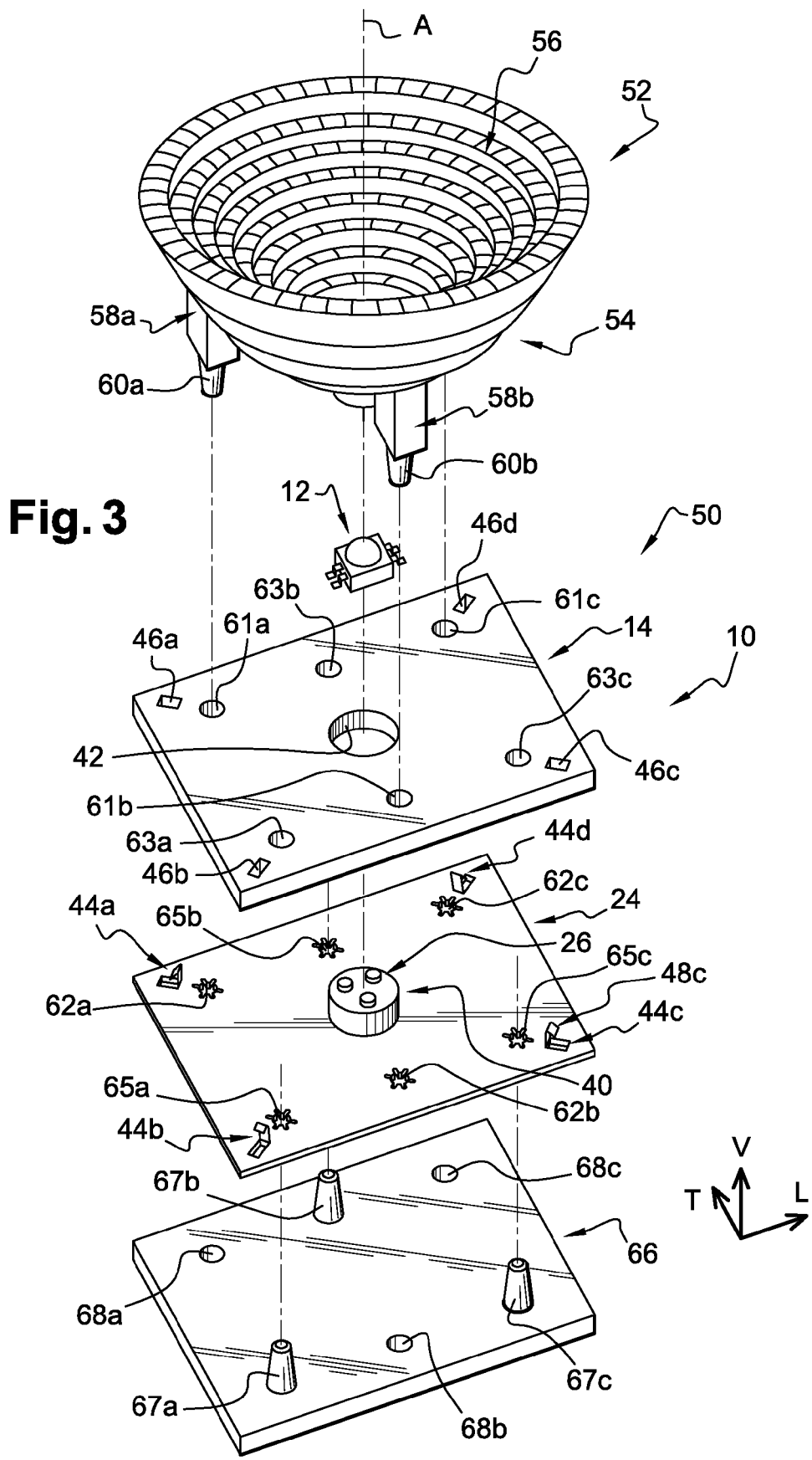

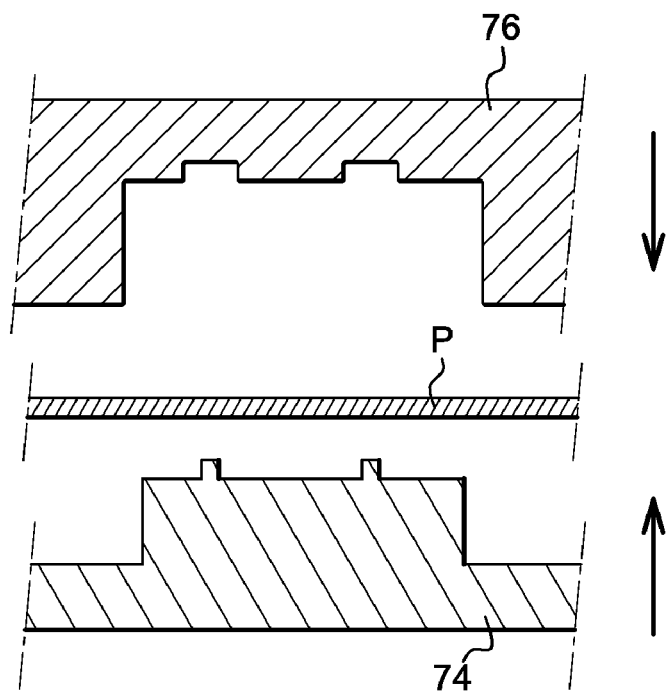
Fig. 6
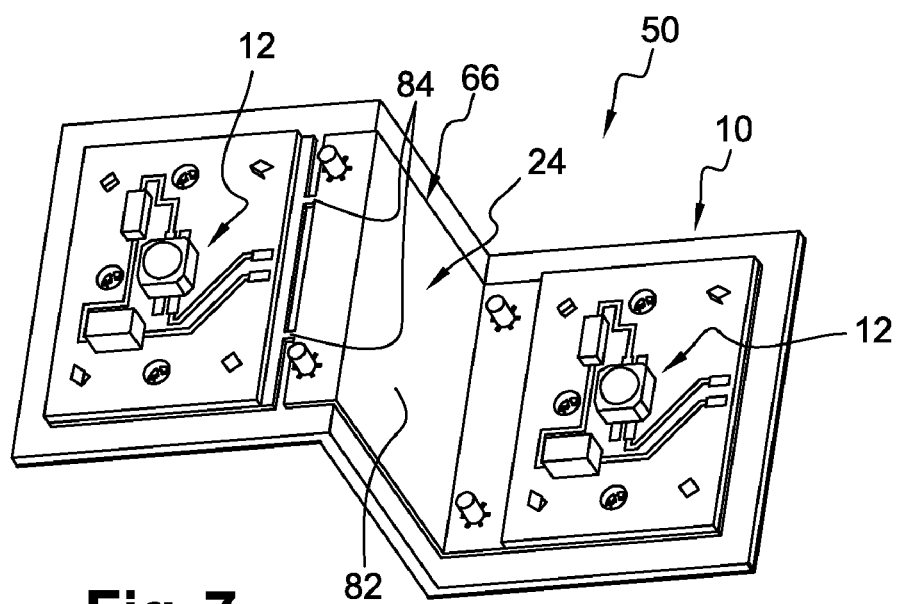
Fig. 7

HEAT DISSIPATION COMPONENT AND DIODE LIGHTING AND/OR SIGNALLING DEVICE EQUIPPED WITH A COMPONENT OF THIS TYPE

CROSS-REFERENCE TO RELATED APPLICATIONS

This application claims priority to French Application No. 0604575 filed May 22, 2006, which application is incorporated herein by reference and made a part hereof.

BACKGROUND OF THE INVENTION

1. Field of the Invention

The invention relates to a heat dissipation component for a light-emitting diode.

It also relates to a lighting and/or signalling device equipped with a heat dissipation component and to a method for manufacturing a device of this type.

The technical field of the invention is, generally, that of headlamps, signalling and/or lighting components for motor vehicles, comprising at least one light-emitting diode, in particular what is known as a "power" light-emitting diode.

2. Description of the Related Art

The prior art has already proposed the use of a light-emitting diode on account of the numerous advantages that it has.

Indeed, the diode consumes less electrical power, even at the same light flux intensity, than a discharge or incandescent lamp traditionally used in the motor vehicle field.

The diode does not radiate omnidirectionally but rather radiates in a more directional manner than the discharge lamp. Thus, the amount of light, and therefore electrical power, lost is less.

However, during its operation, the diode produces heat. Heating of the diode is detrimental to orderly operation thereof, as the higher the temperature of the diode rises, the more its light flux decreases.

In order to lower its operating temperature, the diode comprises a metal heat dissipation base, often referred to as a "slug", allowing thermal contact to be established with a heat dissipater, such as a heatsink, in order to dissipate the heat produced by the diode.

Numerous components allowing the heat of a light-emitting diode to be dissipated are known.

Document EP-A-1 463 391, in the name of the Applicant, relates to a method and a component of the same type. However, the method for fixing the base of the diode to the heat dissipater is necessarily carried out by an expensive welding process, laser spot welding.

The present invention seeks, in particular, to provide a solution allowing use to be made of other fixing methods, such as fusion welding in a furnace, despite the fragility of components such as the light-emitting diode.

Document EP-A-1 139 019 describes a heat dissipation component associated with a power light-emitting diode, of which each of the two electrical connection tabs is electrically connected to a track of a printed circuit board.

The printed circuit board extends above a copper heat dissipater, forming a vacuum between the printed circuit board and the heat dissipater.

The printed circuit board comprises a through-hole in which the diode is arranged, so that the heat dissipation base of the diode establishes thermal contact with the copper heat dissipater.

A heat conduction agent is arranged between the heat dissipation base of the diode and the heat dissipater in order to improve the heat conduction between the base of the diode and the heat dissipater.

A dissipater of this type allows the heat produced by the diode to be discharged effectively but does not allow precise orientation of the diode.

Indeed, the base of the diode is arranged on a heat conduction agent of the thermal grease, thermal paste, thermal adhesive type, which is therefore not solid. Accordingly, the heat conduction agent used is not a reference surface allowing the diode to be oriented in a precise manner.

Similarly, the tabs for fixing the diode that fix the diode to the printed circuit board do not provide a reliable positioning reference in view, in particular, of their flexibility.

However, in the case of a lighting and/or signalling device, the relative position of the light beam emitted by the diode in relation to an optical element, such as a light reflector and/or a lens, has to be precise if optimum output of the lighting and/or signalling device is to be obtained.

Moreover, the design of the dissipation component described in document EP-A-1 139 019 does not allow a flexible printed circuit board, known as a flexboard, to be used, given that the diode is fixed to the printed circuit board and that a vacuum separates the printed circuit board from the heat dissipater. This aspect is a drawback, in particular if the printed circuit board is to be arranged in various planes.

SUMMARY OF THE INVENTION

The invention proposes a heat dissipation component allowing thermal contact to be established between the base of a diode and a heat dissipater in order to dissipate the heat produced by the diode while at the same time precisely orienting the diode.

For this purpose, the invention proposes a heat dissipation component for a vehicle lighting and/or signalling device of the type comprising:

an electrically insulating printed circuit board comprising at least two electrically conductive tracks, at least one light-emitting diode comprising a heat dissipation base and a pair of electrical connection tabs, each connection tab having to be electrically connected to a conductive track of the printed circuit board, a heat dissipater extending facing the printed circuit board, such that the heat dissipater comprises at least one heat exchange portion capable of being coupled to a heat exchange face of the base of at least one associated diode and that said heat exchange portion of the heat dissipater comprises means for orienting at least one associated diode that protrude in the region of the heat exchange portion of the dissipater, the heat exchange face of the base of each diode being intended to be placed on said orienting means, in particular in such a way that a reference direction of each diode is oriented relative to a reference plane of the dissipater.

According to further features of the heat dissipation component:

the orienting means protrude substantially perpendicularly to the heat exchange portion of the dissipater, the orienting means comprise a plurality of studs protruding perpendicularly to the heat exchange portion at dimensions allowing the reference direction of each diode to be determined, the orienting means comprise at least two ribs protruding perpendicularly to the heat exchange portion, the heat dissipater comprises an embossment on which there is arranged the heat exchange portion of the dissipater, the heat dissipation component comprises a contributed material arranged between the heat exchange portion of the heat dissipater and the heat exchange face of the base of each associated diode, in order to fix the heat exchange portion with the base of each diode and/or to form a heat seal between the heat exchange portion and the base of each diode, the heat dissipater comprises means for centering each associated diode relative to the reference plane of the dissipater, the heat dissipater comprises means for fixing to the printed circuit board, the heat dissipater is made of a material capable of undergoing plastic deformation, such as a ductile material, the heat dissipater is made of copper or of copper alloy having a thickness determined as a function of given heat conduction properties, the printed circuit board comprises at least one hole through which there extends at least one diode and/or the heat exchange portion of the dissipater, the printed circuit board is flexible and is capable of being held on the dissipater by fixing means.

The invention also relates to a lighting and/or signalling device of the type comprising at least one heat dissipation component and a support which is fixed to the heat dissipation component by means of fixing pins, the fixing pins being fixed in associated openings in the heat dissipater.

According to further features of the signalling and/or lighting device:

the signalling and/or lighting device comprises an optical element, such as a filter and/or a lens and/or a reflector, which is arranged on the printed circuit board and which is fixed to the heat dissipater by means of fixing pins, the fixing pins passing through the printed circuit board and being fixed in associated openings in the heat dissipater, the component comprises a single dissipater comprising a plurality of heat exchange portions, the heat exchange portions each being arranged in a differing plane, each heat exchange portion comprising at least one diode and a single support which supports the dissipater in the various planes, the single dissipater comprises means for mutually electrically disconnecting the heat exchange portions.

The invention also relates to a method for manufacturing the lighting and/or signalling device, such that the method includes a step of forming the heat dissipater in such a way that at least one projection is formed by plastic deformation on the surface of the dissipater in line with the base of each associated diode so as to form means for orienting each diode.

According to further features of the manufacturing method:

the step of forming the heat dissipater consists in forming at least one projection by plastic deformation on the surface of the dissipater so as to form means for centering each diode, the step of forming the heat dissipater consists in forming at least one projection by plastic deformation on the surface of the heat dissipater so as to form an embossment carrying means for orienting and/or means for centering each associated diode, the method includes a step of cutting and folding the heat dissipater in such a way that at least one hook is formed, so as to form means for fixing the dissipater to the printed circuit board, the method includes a step of punching the heat dissipater in such a way that at least one opening is formed in the dissipater so as to form means for fixing the support and/or the optical element, the method includes a step of inserting each hook into an associated opening in the printed circuit board so as to fix the heat dissipater to the printed circuit board, the method includes a step of welding or soldering or bonding the base of each diode to the heat exchange portion of the associated dissipater after having arranged each diode on the means for orienting the dissipater and/or positioned each diode relative to the centering means, the method includes a step of joining the support to the heat dissipater consisting in introducing each pin for fixing the support into an associated opening in the heat dissipater, the method includes a step of joining an optical element to the heat dissipater consisting in introducing each pin for fixing the optical element into an associated opening in the heat dissipater.

Further features and advantages of the invention will become apparent on reading the following detailed description, for the understanding of which reference will be made to the enclosed drawings, in which:

FIG. 3 is an exploded perspective view illustrating a heating and/or signalling device according to a particular embodiment of the invention and comprising a heat dissipation component of the type shown in FIG. 1;

FIG. 6 is a schematic view illustrating a method for manufacturing by molding of the heat dissipater from FIG. 1;

FIG. 7 is a perspective view illustrating a variation of the lighting and/or signalling device from FIG. 3;

Figure 1:
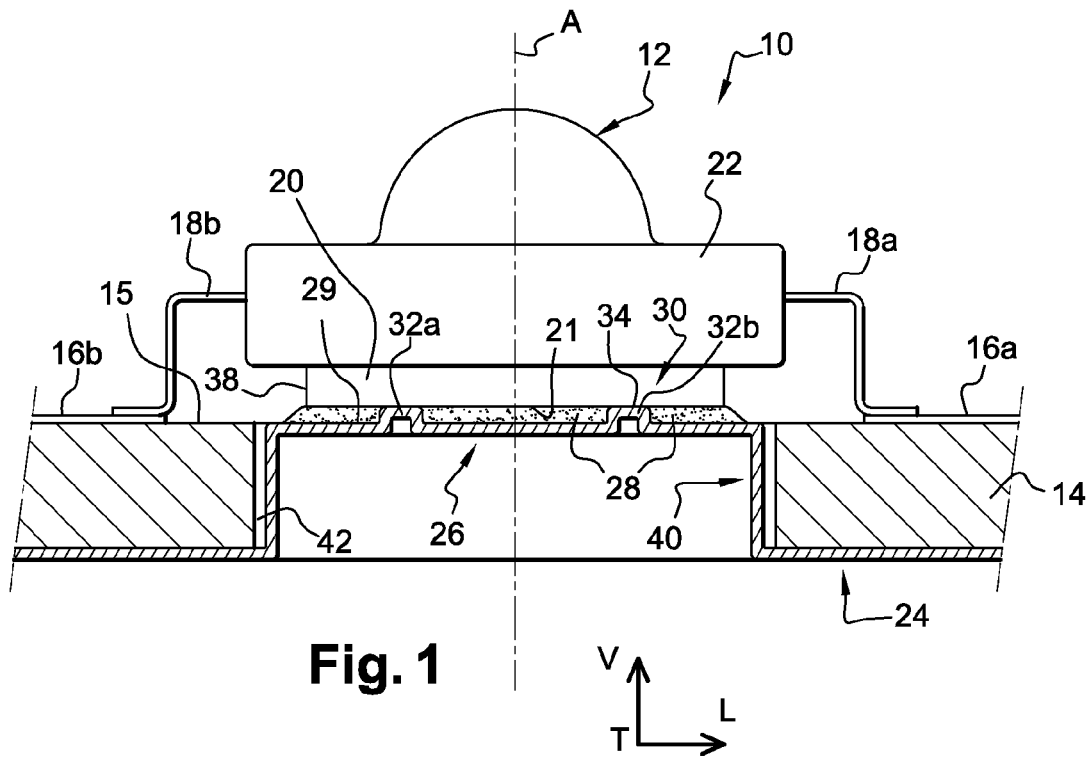
FIG. 1 is a front view in cross section along axis 1-1 from FIG. 2A or 2B, illustrating a diode arranged on a heat dissipater of a heat dissipation component according to the teachings of the invention.

In the description and the claims, terms such as "upper" and "lower" shall be used without limitation with reference to the figures and definitions given in the description and the orientations "longitudinal", "transverse" and "vertical" with reference to the trihedron L, V, T shown in the figures.

Moreover, identical, similar or analogous elements will be denoted by the same reference numerals.

FIG. 1 shows a heat dissipation component 10 for a power light-emitting diode 12.

The dissipation component 10 comprises a horizontally extending printed circuit board 14. In a known manner, the printed circuit board 14 is rigid and made of an electrically insulating material, for example of epoxy resin and glass fabric.

The upper face 15 of the printed circuit board 14 comprises two electrically conductive tracks 16a, 16b which are each electrically connected to a lateral electrical supply tab 18a, 18b of the diode 12.

The diode 12, or LED, comprises a lower heat dissipation base 20, also referred to as a "slug", which is advantageously made of copper or of copper alloy. The base 20 of the diode 12 is in this case of cylindrical shape having an axis A and comprises a horizontal heat exchange face 21.

By way of non-limiting example, the base 20 can, for example, be hexagonal or circular in section.

The diode 12 is capable of producing a light beam having an upward optical axis A, in a reference direction, in this case a direction perpendicular to the base 20 of the diode 12.

The heat dissipation component 10 comprises a heat dissipater 24, or heatsink, extending generally horizontally below the printed circuit board 14. The dissipater 24 thus has a reference plane.

The dissipater 24 comprises an embossment 40 extending vertically upward through a through-hole 42 in the printed circuit board 14.

The upper part of the embossment 40 comprises a horizontal heat exchange portion 26 which is in thermal contact with the base 20 of the diode 12 in order to discharge the heat produced by the diode 12 during operation thereof.

Thus, the embossment 40 raises the diode 12 in such a way that the tabs 18a, 18b of the diode 12 are capable of being connected to the associated conductive tracks 16a, 16b.

The dissipater 24 is made of copper having a low thickness, of approximately half a millimeter, so as to obtain a "nervous" heat dissipater 24, i.e. a dissipater 24 which is capable of rising rapidly in temperature in order rapidly to dissipate the heat produced by the diode 12.

By way of a non-limiting example, the dissipater 24 can be made of pure copper protected by a nickel or tin layer or it can be made of an alloy of bronze and beryllium, for example.

The use of copper allows the dissipater 24 to reach a stabilized temperature more rapidly than with, for example, aluminum of equal thickness and size.

Figure 2A:
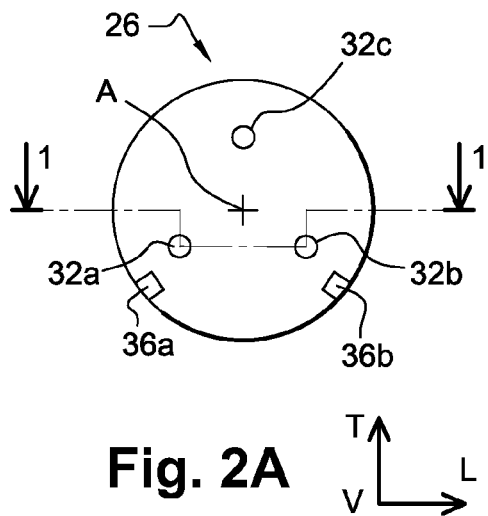
FIG. 2A is a detailed plan view of a heat exchange portion of the heat dissipater in a first embodiment of the component from FIG. 1.

FIG. 2A shows a heat exchange portion 26 of the heat dissipater 24 in a first embodiment of the component 10.

BRIEF DESCRIPTION OF THE ACCOMPANYING DRAWINGS

In this embodiment, orienting means 32a, 32b, 32c allow reduction of the contact with the surface 21 of the base 20 of the diode 12 over zones which reduce ideally to a point.

The means 32a, 32b, 32c for orienting the diode 12 comprise three studs 32a, 32b, 32c protruding vertically upward, perpendicularly to the heat exchange portion 26 of the dissipater 24.

Each stud 32a, 32b, 32c comprises an upper face 34 on which the heat exchange face 21 of the base 20 of the diode 12 is held in contact. The three studs 32a, 32b, 32c are arranged uniformly, delimiting an equilateral triangle.

According to variations, it is possible to arrange the studs 32a, 32b, 32c in other configurations or in a different number.

In the embodiment of FIG. 2A, the upper faces 34 of the studs 32a, 32b, 32c extend in a single horizontal plane which is parallel to the reference plane of the dissipater 24.

In this way, the optical axis A of the diode 12 is oriented in the reference direction, perpendicularly to the reference plane of the dissipater 24, because the optical axis A the diode 12 is perpendicular to the plane of the exchange face 21 of the base 20.

However, the upper faces 34 of the studs 32a, 32b, 32c can extend in a non-horizontal oblique plane so as to orient the optical axis A of the diode 12 in an oblique manner relative to the reference plane of the dissipater 24.

Thus, the orienting means 32a, 32b, 32c allow, during the manufacture of the dissipater 24, the relative orientation of the reference direction of each diode 12 to be determined at least one reference plane of the dissipater 24.

For this purpose, the height of each stud 32a, 32b, 32c is determined during its formation relative to the reference plane of the dissipater 24.

Figure 2B:
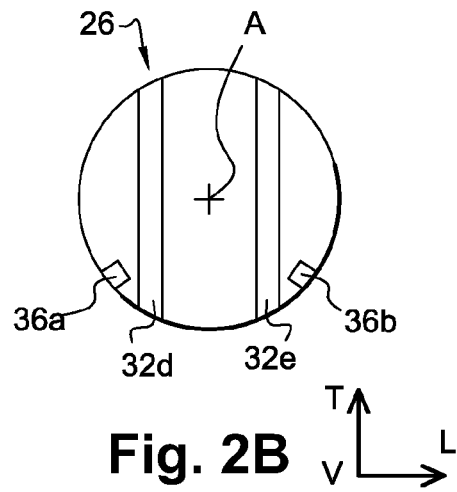
FIG. 2B is a detailed plan view of a heat exchange portion of the heat dissipater in a second embodiment of the component from FIG. 1.

FIG. 2B shows a heat exchange portion 26 of the heat dissipater 24 in a second embodiment of the component 10.

In this embodiment, orienting means 32d, 32e allow reduction of the contact with the heat exchange face 21 of the base 20 of the diode 12 over zones which ideally each reduce to a line.

DETAILED DESCRIPTION OF THE PREFERRED EMBODIMENTS

In this embodiment, means 32d, 32e for orienting the diode 12 comprise two parallel ribs 32d, 32e protruding vertically upward and each comprising an upper horizontal face on which the heat exchange face 21 of the base 20 of the diode 12 is capable of being held in contact.

Referring back to FIG. 1, the base 20 of the diode 12 is held on or joined to the studs 32a, 32b, 32c by means of a contributed material 28.

The contributed material 28, represented by a series of dots in FIG. 1, is in this case solder paste 28 arranged between the heat exchange face 21 of the base 20 of the diode 12 and the upper face 29 of the exchange portion 26.

The contributed material 28 is capable of thermally connecting the heat exchange face 21 of the base 20 of the diode 12 and the upper face 29 of the exchange portion 26.

Moreover, the contributed material 28 has a low thickness, of approximately a few microns, advantageously of approximately ten to thirty microns, so as to form a heat seal capable of conducting the heat between the base 20 of the diode 12 and the heat exchange portion 26 of the dissipater 24, the diode 12 then being both joined to the heat exchange portion 26 and thermally coupled thereto.

By way of a non-limiting example, the contributed material 28 can be any viscous-type material which is capable of fixing and/or bonding the base 20 of the diode 12 to the studs 32a, 32b, 32c.

Similarly, the contributed material 28 can be a heat conduction agent without fixing power, such as grease, in which case the diode 12 is fixed by its fixing tabs 18a, 18b to the tracks 16a, 16b of the printed circuit board 14.

However, the contributed material 28 is in this case an alloy of solder paste comprising tin, silver and copper, also known under the name Sn96 5Ag3 Cu0.5.

In an embodiment illustrated in FIGS. 2A and 2B, the heat dissipater 24 comprises means 36a, 36b for centering the diode 12 relative to the heat dissipater 24.

In this particular embodiment, two stops 36a, 36b are formed along a vertical axis perpendicular to the heat exchange portion 26 of the dissipater 24.

The two stops 36a, 36b protrude vertically upward. The two stops 36a, 36b are arranged in a single half-space of the diode 12 so as to abut the peripheral edge 38 of the base 20 when the diode 12 is deposited.

For this purpose, it will be noted that the two stops 36a, 36b are higher than the studs 32a, 32b, 32c along an extension providing reliable stability of the diode 12 before it is joined to the dissipater 24 as described hereinbefore.

Thus, the diode 12 is precisely three-dimensionally positioned relative to the heat dissipater 24.

Figure 5:
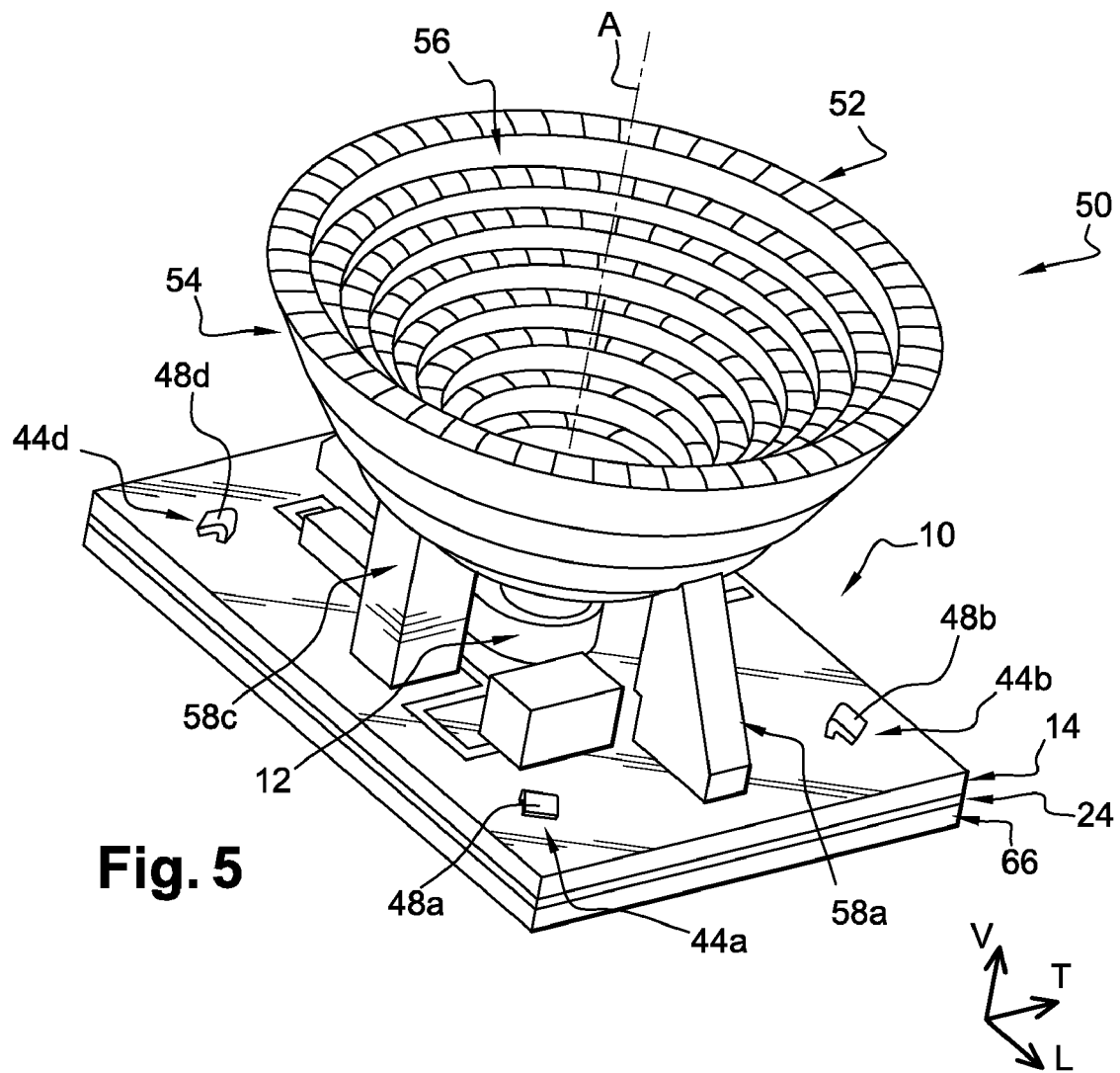
FIG. 5 is a perspective view of the lighting and/or signalling device from FIG. 3.

As may be seen from FIGS. 3 and 5, the heat dissipater 24 comprises four hooks 44a, 44b, 44c, 44d or claws, forming relative means for fixing the dissipater 24 to the printed circuit board 14.

The four hooks 44a, 44b, 44c, 44d extend generally vertically upward from the heat dissipater 24, each through an associated hole 46a, 46b, 46c, 46d in the printed circuit board 14.

Each hook 44a, 44b, 44c, 44d comprises at its free end a return portion 48a, 48b, 48c, 48d which locks the dissipater 24 against the printed circuit board 14.

The invention also relates to a lighting and/or signalling device 50 which is shown in FIGS. 3 and 5 and which comprises a heat dissipation component 10 of the type described hereinbefore.

The lighting and/or signalling device 50 comprises an optical element 52. The term "optical element" 52 refers to a part or a set of parts allowing the light flux produced by the diode 12 to be acted on, such as a filter, a lens and/or a reflector.

The optical element 52 is in this case a light reflector 54 in which there is arranged a Fresnel lens 56.

In a known manner, the Fresnel lens 56 comprises a plurality of coaxial circular stages, forming overall a downwardly decreasing truncated cone-shaped section.

The optical element 52 is arranged along the reference axis A of the diode 12.

The reflector 54 comprises three feet 58a, 58b, 58c which rest on the upper face 15 of the printed circuit board 14. The free end of each foot 58a, 58b, 58c comprises respectively a generally truncated cone-shaped fixing pin 60a, 60b, 60c extending vertically downward.

Each fixing pin 60a, 60b, 60c is accommodated in a through-hole 61a, 61b, 61c in the printed circuit board 14 and is fixed in an associated opening 62a, 62b, 62c in the dissipater 24.

Figure 4:
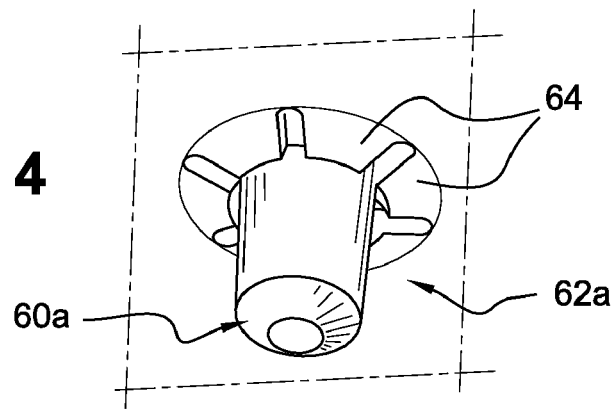
FIG. 4 is a detailed view of the device from FIG. 3 showing on an enlarged scale a pin for fixing an optical element which is accommodated in an opening in the heat dissipater from FIG. 1.

As may be seen in detail in FIG. 4, each opening 62a, 62b, 62c is formed in the dissipater 24 and is characterized by a generally circular shape, the internal periphery of which has a plurality of retaining tongues 64. Each opening 62a, 62b, 62c thus forms an element known to a person skilled in the art as a crimping. It should be noted that an opening 62a, 62b, 62c having merely a single retaining tongue 64 also constitutes a crimping.

For example, the retaining tongues 64 are arranged over the entire periphery of each opening 62a, 62b, 62c. Each retaining tongue 64 is characterized by a base, attached directly to the dissipater 24, and by a free end oriented toward the central part of each opening 62a, 62b, 62c.

Thus, during the step of introducing one of the fixing pins 60a, 60b, 60c into the associated opening 62a, 62b, 62c, each retaining tongue 64 can undergo slight deformation in the direction of the introducing movement. The free ends of each retaining tongue 64 then accompany the associated fixing pin 60a, 60b, 60c in its travel.

The plurality of retaining tongues 64 of each opening 62a, 62b, 62c allows optimum holding of the associated fixing pin 60a, 60b, 60c. The ductile nature of the material used to produce the dissipater 24, and therefore to produce the retaining tongues 64, has this additional advantage of hindering a movement opposing the movement for introducing the fixing pin 60a, 60b, 60c into the associated opening 62a, 62b, 62c.

If the dissipater 24 is made of copper, its thickness is advantageously between 0.4 and 0.8 millimeters thick, so as to provide crimpings as described hereinbefore.

Advantageously, the lighting and/or signalling device 50 comprises a support 66 which is made of plastics material and extends below the dissipater 24, as shown in FIGS. 3 and 5.

The support 66 comprises a plurality of, in this case three, fixing pins 67a, 67b, 67c which are generally truncated cone-shaped and extend vertically upward. Each fixing pin 67a, 67b, 67c is arranged in an associated opening 65a, 65b, 65c in the dissipater 24. Each opening 65a, 65b, 65c is of the "crimping" type as described hereinbefore.

Each fixing pin 67a, 67b, 67c leads into an associated through-hole 63a, 63b, 63c in the printed circuit board 14.

By way of example, the support 66 comprises three through-holes 68a, 68b, 68c through each of which leads one of the pins 60a, 60b, 60c of the optical element 52.

The method for manufacturing the heat dissipater 24 will now be described.

Advantageously, the embossment 40, the studs 32a, 32b, 32c forming means for orienting the diode 12 and the stops 36a, 36b forming means 36a, 36b for centering the diode 12 are produced during a single step of forming by plastic deformation, for example by molding or stamping.

As may be seen from FIG. 6, the forming step is in this case a molding operation consisting in shaping a copper plate P by placing it between two molds 74, 76 and by striking it one or more times so as to obtain the dissipater 24 forged in the desired size and shape described hereinbefore.

The openings 62a, 62b, 62c and 65a, 65b, 65c, or "crimpings", in the dissipater 24 are formed during a step of punching the heat dissipater 24 using a punching tool.

Finally, the four hooks 44a, 44b, 44c, 44d forming the fixing means are produced during a cutting and folding step.

According to a preferred embodiment, the forming step, which consists, in particular, in forming the centering means 36a, 36b and orienting means 32a, 32b, 32c, is carried out following the punching and cutting and folding steps, so as not to impair said centering means 36a, 36b and orienting means 32a, 32b, 32c.

The method for manufacturing the heat dissipation component 10 will now be described.

Once formed, the dissipater 24 is fixed against a lower face of the printed circuit board 14 in such a way that the four fixing hooks 44a, 44b, 44c, 44d lock the dissipater 24 to the printed circuit board 14, as shown in FIG. 5.

Advantageously, the return portions 48a, 48b, 48c, 48d of the fixing hooks 44a, 44b, 44c, 44d are folded on the upper face of the printed circuit board 14 in order to lock the dissipater 24 to the board 14 without play.

The contributed material 28, in this case the solder paste 28, is arranged cold on the upper face 29 of the heat exchange portion 26.

The base 20 of the diode 12 is deposited against the studs 32a, 32b, 32c and on the solder paste 28, the thickness of which is gauged beforehand by a paste gauge strip.

Then, the base 20 of the diode 12 is arranged on the orienting studs 32a, 32b, 32c and is positioned in abutment against the means 36a, 36b for centering the diode 12.

Thus, the solder paste 28 spreads globally over the entire surface area of the base 20 of the diode 12, except for on the surface which is in contact with the upper surface 34 of the orienting means 32a, 32b, 32c.

Solder paste 28 is also arranged between each of the lateral electrical supply tabs 18a, 18b of the diode 12 and each of the associated conductive tracks 16a, 16b.

The assembly formed by the diode 12, printed circuit board 14 and dissipater 24 is passed into a furnace at a temperature of between approximately 240° C. and 260° C. for a period of time of approximately ten to thirty seconds so that the solder paste 28 melts and forms a connection seal between the parts with which the solder paste 28 is arranged.

The method for manufacturing the lighting and/or signalling device 50 according to the invention will now be described.

The support 66 is fixed to the heat dissipation component 10 by introducing each pin 67a, 67b, 67c for fixing the support 66 into the associated opening 65a, 65b, 65c in the heat dissipater 24.

Similarly, the optical element 52 is fixed relative to the heat dissipation component 10 by introducing each pin 60a, 60b, 60c for fixing the optical element 52 through the through-holes 61a, 61b, 61c in the printed circuit board 14, then by introducing each pin 60a, 60b, 60c into the associated opening 62a, 62b, 62c in the heat dissipater 24.

According to a variation of the invention, the printed circuit board 14 can be a flexible film of the "flexboard" type, made for example of plastics material, the mechanical strength of which is such that said printed circuit board 14 is capable of being fixed to the dissipater 24, in particular by means of the hooks 44a, 44b, 44c, 44d.

Therefore, the printed circuit board 14 can be "multilayered", i.e. each of its large faces comprises a network of conductive tracks. In this case, the face of the dissipater 24 that is in contact with the board 14 is electrically insulated.

According to a further variation (not shown) of the heat dissipation component 10, the heat dissipater 24 comprises an embossment 40 or a rib on which there is arranged a plurality of heat exchange portions 26 on each of which there is arranged a diode 12, assuming that electrically short-circuiting the bases 20 of the diodes 12 is not a problem.

Figure 9:
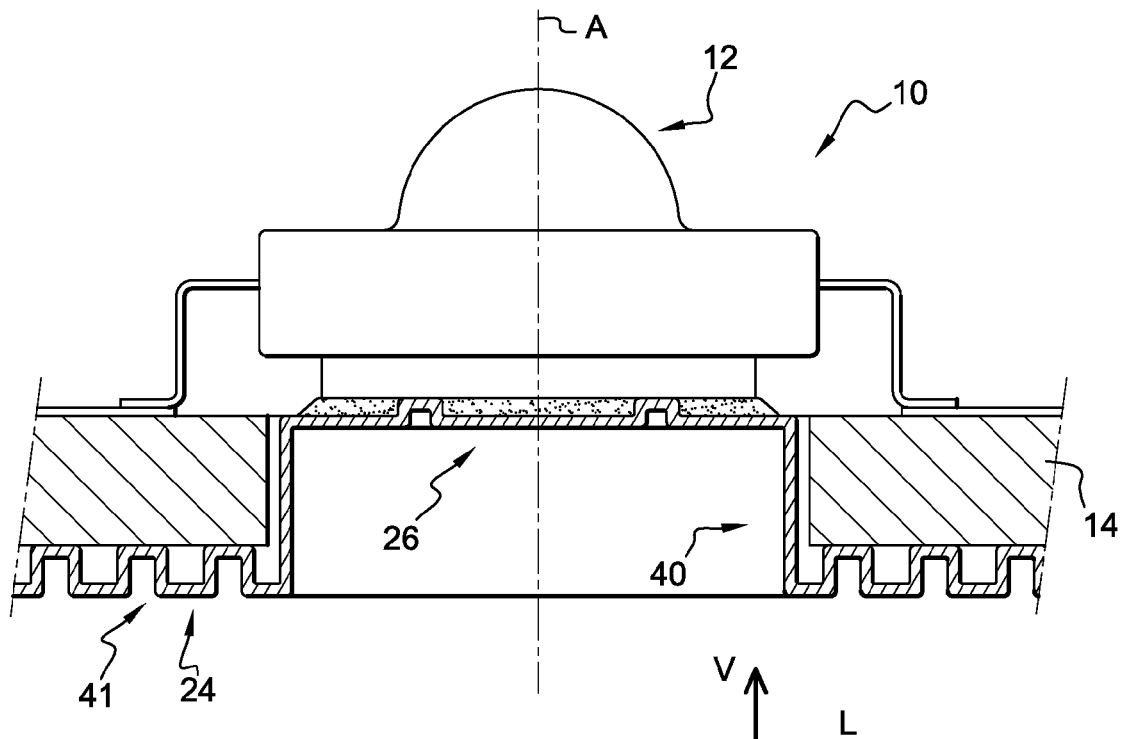
FIG. 9 is a view similar to that of FIG. 1, illustrating a variation of the heat dissipater.

According to a further variation, the heat dissipater 24 can comprise a plurality of slots 41 or fins 41 which are arranged facing the printed circuit board 14 and which are formed from alternating vertical and horizontal faces, as may be seen in FIG. 9.

Thus, the slots or fins 41 allow the dissipater 24 to be rigidified, the heat exchange surface area of the dissipater 24 to be increased in the vicinity of the heat exchange portion 26 of the dissipater 24 and the contact with the printed circuit board 14 to be limited in order to transfer less heat to the printed circuit board 14.

According to a further variation (not shown), the heat dissipater 24 of the heat dissipation component 10 can extend laterally and generally vertically either side of the printed circuit board 14, so as to increase the heat exchange surface area of the dissipater 24.

Figure 8:
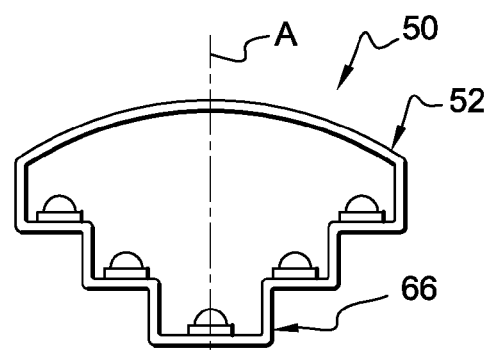
FIG. 8 is a schematic view illustrating a variation of the lighting and/or signalling device from FIG. 3.

According to a variation illustrated in FIG. 8, the heat dissipation component 10 of the lighting and/or signalling device 50 comprises a plurality of heat exchange portions 26. The heat exchange portions 26 are arranged symmetrically in planes which are generally horizontal and generally mutually parallel, either side of a median plane of symmetry. Each heat exchange portion 26 comprises at least one diode 12.

By way of non-limiting example, the planes in which the heat exchange portions 26 are arranged can be substantially inclined relative to one another in such a way that the optical axes of the diodes 12 converge or diverge to form a light beam. Similarly, the device 50 is not necessarily symmetrical.

According to this variation, the lighting and/or signalling device 50 comprises an optical element 52 arranged in the median plane of symmetry along the overall optical axis A.

Moreover, the heat exchange portions 26 are formed in a single dissipater 24.

For this purpose, the successive portions of the dissipater 24 comprising the heat exchange portions 26 are interconnected by a connection portion 82 shown in FIG. 7.

Each connection portion 82 of the dissipater 24 comprises means for mutually electrically disconnecting the heat exchange portions 26.

The disconnecting means comprise in this case a pair of tabs 84 which are severed during the manufacture of the lighting and/or signalling device 50 so as electrically to disconnect the heat exchange portions 26 and the bases 20 of the diodes 12.

Finally, the lighting and/or signalling device 50 comprises a single support 66 in the form of steps extending against the dissipater 24 in order to support it.

The heat dissipation component 10 according to the invention allows the optical axis A of each diode 12 to be oriented and positioned precisely along the reference plane of the dissipater 24.

Indeed, the method for manufacturing the orienting studs 32a, 32b, 32c allows precise dimensions and tolerances to be obtained.

Moreover, the added material 28 allows the dissipater 24 to be held against the base 20 of the diode 12 without influencing the orientation and the positioning of the diode 12.

Furthermore, the thickness of the added material 28 is closely controlled, since its thickness is equal to the height of the studs 32a, 32b, 32c. The thickness of the heat exchange portion 26 of the dissipater 24 is also closely controlled, allowing the coefficient of thermal conductivity of the heat dissipater 24 and also the thermal "nervousness" thereof to be controlled.

Finally, the openings 62a, 62b, 62c and 65a, 65b, 65c, or "crimpings", in the heat dissipater 24 allow the optical element 52 and the support 66 to be positioned and fixed in a precise manner relative to the dissipater 24.

While the method herein described, and the form of apparatus for carrying this method into effect, constitute preferred embodiments of this invention, it is to be understood that the invention is not limited to this precise method and form of apparatus, and that changes may be made in either without departing from the scope of the invention, which is defined in the appended claims.

What is claimed is:

1. A lighting or signaling device comprising:
   an electrically insulating printed circuit board comprising at least two electrically conductive tracks;
   at least one light-emitting diode comprising a heat dissipation base and a pair of electrical connection tabs, each connection tab having to be electrically connected to a conductive track of said printed circuit board, said heat dissipation base comprising a heat exchange face; and
   a heat dissipater extending facing said printed circuit board, wherein said heat dissipater comprises at least one heat exchange portion being coupled to said heat exchange face of said at least one light-emitting diode, said at least one heat exchange portion of said heat dissipater comprises orienting means for orienting said at least one light-emitting diode, said orienting means protruding from a region of said at least one heat exchange portion of said heat dissipater, said heat exchange face of said at least one light-emitting diode being placed on and in direct contact with said orienting means, said orienting means engaging said heat dissipation base and orienting each of said at least one light-emitting diodes relative to a reference plane of said heat dissipater;
   wherein said at least one heat exchange portion comprises a non-orienting portion corresponding to areas of the heat exchange portion that do not comprise said orienting means, said device further comprising a contributing material arranged between said non-orienting portion of said heat dissipater and said heat exchange face of said heat dissipation base of each associated diode, in order to fix said non-orienting portion with said heat dissipation base of each diode and to form a heat seal between said at least one heat exchange portion and said heat dissipation base of each diode;

wherein said contributing material is not arranged between said orienting means and said heat dissipation base.

2. The lighting or signaling device according to claim 1, wherein said orienting means protrude substantially perpendicularly to said at least one heat exchange portion of said heat dissipater.

3. The lighting or signaling device according to claim 1, wherein said orienting means comprise a plurality of studs protruding perpendicularly to said at least one heat exchange portion at dimensions allowing a reference direction of each diode to be determined.

4. The lighting or signaling device according to claim 2, wherein said orienting means comprise at least two ribs protruding perpendicularly to said at least one heat exchange portion.

5. The lighting or signaling device according to claim 1, wherein said heat dissipater comprises an embossment on which there is arranged said at least one heat exchange portion of said heat dissipater.

6. The lighting or signaling device according to claim 1, wherein said heat dissipater comprises means for fixing said heat dissipater to said printed circuit board.

7. The lighting or signaling device according to claim 1, wherein said heat dissipater is made of a material capable of undergoing plastic deformation.

8. The lighting or signaling device according to claim 1, wherein said heat dissipater is made of copper or of copper alloy having a thickness determined as a function of given heat conduction properties.

9. The lighting or signaling device according to claim 1, wherein said printed circuit board comprises at least one hole through which there extends said at least one heat exchange portion of said heat dissipater.

10. The lighting or signaling device according to claim 1, wherein said printed circuit board is flexible and is capable of being held on said heat dissipater by fixing means.

11. A lighting or signaling device of the type comprising:
at least one heat dissipation component comprising:
an electrically insulating printed circuit board comprising at least two electrically conductive tracks;
at least one light-emitting diode comprising a heat dissipation base and a pair of electrical connection tabs, each connection tab having to be electrically connected to a conductive track of said printed circuit board, said heat dissipation base having a heat exchange face; and
a heat dissipater,
wherein said heat dissipater comprises at least one heat exchange portion capable of being coupled to said heat exchange face, said at least one heat exchange portion of said heat dissipater comprises orienting means for orienting said at least one light-emitting diode, said orienting means protruding from said at least one heat exchange portion of said heat dissipater in order to engage said heat exchange base and orient said at least one light-emitting diode relative to a reference plane of said heat dissipater, said heat exchange face of each of said at least one light-emitting diode being placed on and in direct contact with said orienting means; and a support which is fixed to said at least one heat dissipation component by means of fixing pins, said fixing pins being fixed in associated openings in said heat dissipater;

wherein said at least one heat exchange portion comprises a non-orienting portion corresponding to areas of the heat exchange onion that do not comprise said orienting means, said device further comprising a contributing material arranged between said non-orienting portion of said heat dissipater and said heat exchange face of said heat dissipation base of each associated diode, in order to fix said non-orienting portion with said heat dissipation base of each diode and to form a heat seal between said at least one heat exchange portion and said heat dissipation base of each diode;

wherein said contributing material is not arranged between said orienting means and said heat dissipation base.

12. The lighting or signaling device according to claim 11, which comprises an optical element, which is arranged on said printed circuit board and which is fixed to said heat dissipater by means of fixing pins, said fixing pins passing through said printed circuit board and being fixed in associated openings in said heat dissipater, wherein said optical element is at least one of a filter, a lens, or a reflector.

13. The lighting or signaling device according to claim 11, wherein said at least one heat dissipation component comprises:
a single dissipater comprising a plurality of heat exchange portions, said plurality of heat exchange portions each being arranged in a differing plane, each of said plurality of heat exchange portions comprising at least one diode,
a single support supports said heat dissipater in various planes.

14. The lighting or signaling device according to claim 13, wherein said single dissipater comprises means for mutually disconnecting said plurality of heat exchange portions so that there is no electrical connection between or among them.

15. The method for manufacturing a lighting or signaling device, said device being of the type according to claim 11, wherein said method includes a step of forming said heat dissipater to provide at least one projection is formed by plastic deformation on a surface of said heat dissipater in line with a base of each of said at least one light-emitting diode so as to form said orienting means for orienting each of said at least one light-emitting diode.

16. The method for manufacturing a lighting or signaling device according to claim 15, wherein said step of forming said heat dissipater comprises the step of forming said at least one projection by plastic deformation on said surface of said heat dissipater so as to provide means for centering each diode.

17. The manufacturing method according to claim 15, wherein said forming step further comprises the step of forming at least one projection by plastic deformation on a surface of said heat dissipater so as to form an embossment carrying means for orienting each associated diode.

18. The manufacturing method according to claim 15, wherein said method includes a step of cutting and folding said heat dissipater in such a way that at least one hook is formed, so as to form means for fixing said heat dissipater to said printed circuit board.

19. The manufacturing method according to claim 18, wherein said method includes a step of inserting each hook into an associated opening in said printed circuit board so as to fix said heat dissipater to said printed circuit board.

20. The manufacturing method according to claim 18, wherein said method includes a step of joining the support to said heat dissipater consisting in introducing each pin for fixing a support into an associated opening in said heat dissipater.

21. The manufacturing method according to claim 18, wherein said method includes a step of joining an optical element to said heat dissipater consisting in introducing each pin for fixing said optical element into an associated opening in said heat dissipater.

22. The manufacturing method according to claim 15, wherein the method includes a step of punching the heat dissipater in such a way that at least one opening is formed in the heat dissipater so as to form means for fixing the support and/or an optical element.

23. The manufacturing method according to claim 15, wherein said method includes a step of welding or soldering or bonding a base of each diode to said at least one heat exchange portion of an associated dissipater after having arranged each diode on said heat dissipater relative to a centering means.

* * * * *